(12) United States Patent
Tsuchiya et al.

(10) Patent No.: US 12,372,879 B2
(45) Date of Patent: Jul. 29, 2025

(54) APPARATUSES AND METHODS FOR DIFFRACTION BASE OVERLAY MEASUREMENTS

(71) Applicant: MICRON TECHNOLOGY, INC., Boise, ID (US)

(72) Inventors: Kazuko Tsuchiya, Hiroshima (JP); Toshiharu Nishiyama, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 662 days.

(21) Appl. No.: 17/555,364

(22) Filed: Dec. 17, 2021

(65) Prior Publication Data

US 2023/0194996 A1    Jun. 22, 2023

(51) Int. Cl.
*G03F 7/038* (2006.01)
*G03F 7/00* (2006.01)

(52) U.S. Cl.
CPC ........ *G03F 7/70633* (2013.01); *G03F 7/0381* (2013.01); *G03F 7/70141* (2013.01)

(58) Field of Classification Search
None
See application file for complete search history.

(56) References Cited

U.S. PATENT DOCUMENTS

| | | | | |
|---|---|---|---|---|
| 5,632,910 A | * | 5/1997 | Nagayama | H01L 29/66098 430/323 |
| 6,285,455 B1 | * | 9/2001 | Shiraishi | G03F 9/7084 356/486 |
| 2006/0146347 A1 | * | 7/2006 | Smith | G03F 7/70491 356/625 |
| 2013/0214337 A1 | * | 8/2013 | Kashihara | H01L 27/14645 438/34 |
| 2014/0050439 A1 | * | 2/2014 | Liu | G03F 7/70633 438/32 |
| 2018/0090337 A1 | * | 3/2018 | Umeda | G03F 7/26 |

FOREIGN PATENT DOCUMENTS

| | | | | | |
|---|---|---|---|---|---|
| CN | 105633070 A | * | 6/2016 | | |
| CN | 105702662 A | * | 6/2016 | | |
| CN | 110400789 A | * | 11/2019 | ......... | G03F 7/70633 |
| JP | 2000252190 A | * | 9/2000 | | |
| KR | 2004069794 A | * | 8/2004 | ....... | H01L 29/42384 |
| KR | 2012018227 A | * | 2/2012 | ............. | G01B 11/24 |

* cited by examiner

*Primary Examiner* — Martin J Angebranndt
(74) *Attorney, Agent, or Firm* — Dorsey & Whitney LLP

(57) ABSTRACT

Apparatuses and methods of overlay measurement are disclosed. An example apparatus includes: a substrate comprising first material; a first layer comprising second material disposed on a surface of in the substrate; a first alignment pattern including third material disposed in the first layer; and a second layer above the first layer including a second alignment pattern. A difference between refractive indexes of the second material and the third material is greater than a difference between refractive indexes of the first material and the third material.

18 Claims, 6 Drawing Sheets

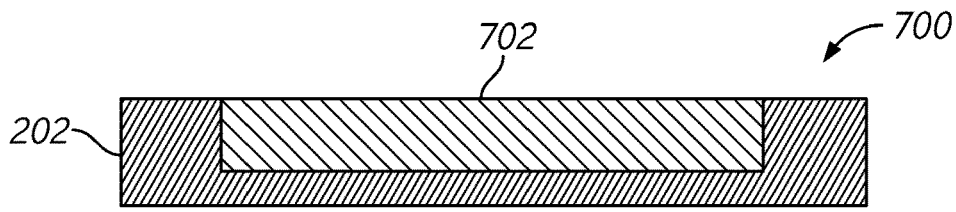
FIG. 7
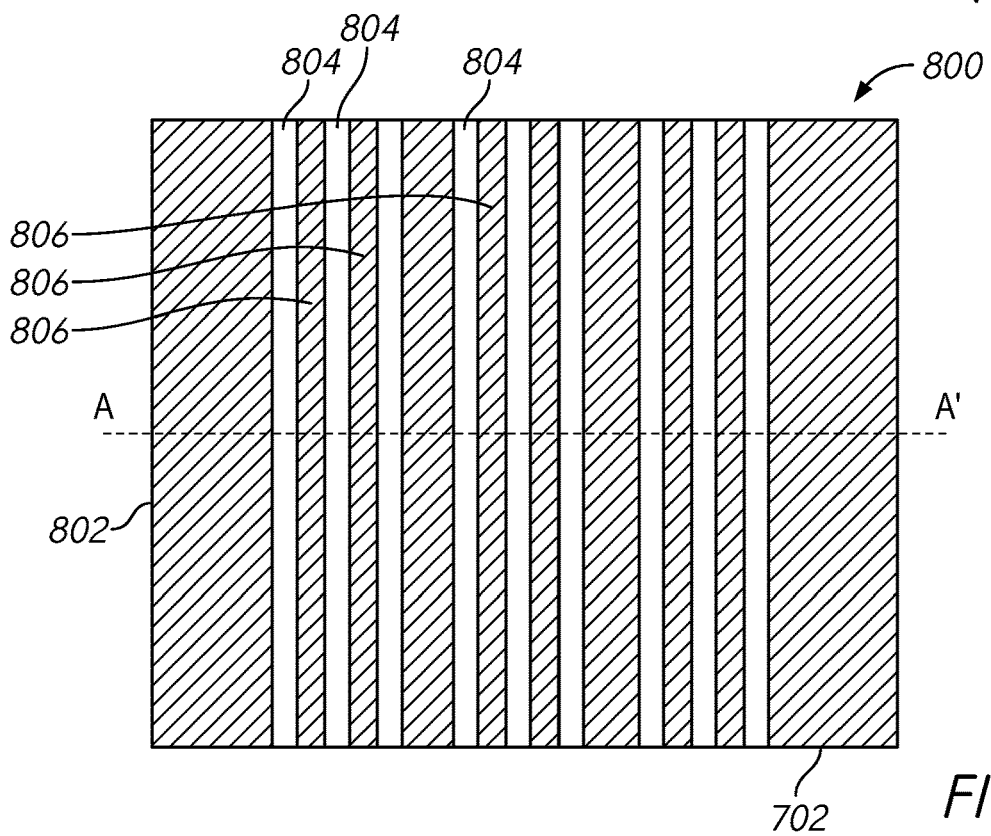
FIG. 8A
FIG. 8B
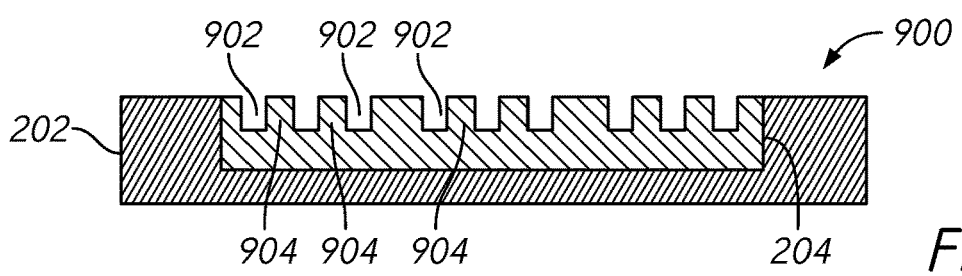
FIG. 9

APPARATUSES AND METHODS FOR DIFFRACTION BASE OVERLAY MEASUREMENTS

BACKGROUND

High data reliability, high speed of memory access, lower power consumption and reduced chip size are features that are demanded from semiconductor memory. Recently in semiconductor memory devices such as dynamic random access memories (DRAMs), static RAMs (SRAMs), flash memories, increased memory capacity and high data reliability with reduced chip size, precision of patterning across layers has been demanded.

In order to measure pattern precision, a diffraction-based overlay (DBO) metrology technique has been used. In the DBO metrology technique, a light may be irradiated from above a semiconductor device including a plurality of layers having similar patterns in an alignment pattern region. Asymmetry of intensities of diffraction of light from the plurality of layers is obtained for each site in an alignment pattern region. Based on asymmetries obtained from a plurality of sites of the semiconductor device, overlays across the patterns of the plurality of layers are computed. Using the DBO metrology technique, accuracy of patterns across layers may be verified and circuit pattern robustness may be improved.

However, due to a small difference between optical constants (e.g., a refractive index "n") of materials, for example, silicon (Si) typically used for a substrate and conductive material and polycrystalline silicon (poly-Si) typically used for a lower pattern disposed in the top portion of the substrate, intensity of diffraction of lights from borders between the substrate and the lower pattern tend to be weak and thus asymmetries may be difficult to obtain. As a result, the DBO measurement fails. In order to improve the intensity of diffraction of lights, a structure that provides a greater difference between optical constants (e.g., a refractive index "n") of a lower pattern and a material facing the border with the lower pattern may be desired.

BRIEF DESCRIPTION OF THE DRAWINGS

FIG. 7 is a diagram of a vertical cross-sectional view of a schematic structure of a site in accordance with an embodiment of the present disclosure.

FIG. 8A is a diagram of a plan view of a schematic structure of a site in accordance with an embodiment of the present disclosure.

FIG. 8B is a diagram of a vertical cross-sectional view of a schematic structure of a site in accordance with an embodiment of the present disclosure.

FIG. 9 is a diagram of a vertical cross-sectional view of a schematic structure of a site in accordance with an embodiment of the present disclosure.

DETAILED DESCRIPTION

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

A semiconductor device may include a pair of alignment patterns including an upper alignment pattern and a lower alignment pattern in an alignment pattern region. The lower alignment pattern may be disposed in a layer that is disposed in a substrate. The layer may include a material that has an optical constant (e.g., a refractive index "n") that is relatively different from the material used in the lower alignment pattern compared to the material of the substrate. For example, the layer may include silicon dioxide (SiO2) or silicon nitride (Si3N4), and the material of the lower alignment pattern may be polycrystalline silicon (poly-Si). The material of the substrate may be silicon (Si). By including the layer in the substrate, differences between optical constants (e.g., a refractive index "n") of the layer and the lower alignment pattern in the layer may become larger and intensity of diffracted light from borders between the layer and the lower alignment pattern may be increased. Thus, the diffracted light from the lower and upper alignment patterns responsive to a light from above may be observed with greater precision, and a more reliable overlay measurement may be performed with relatively few additional steps.

Figure 1:
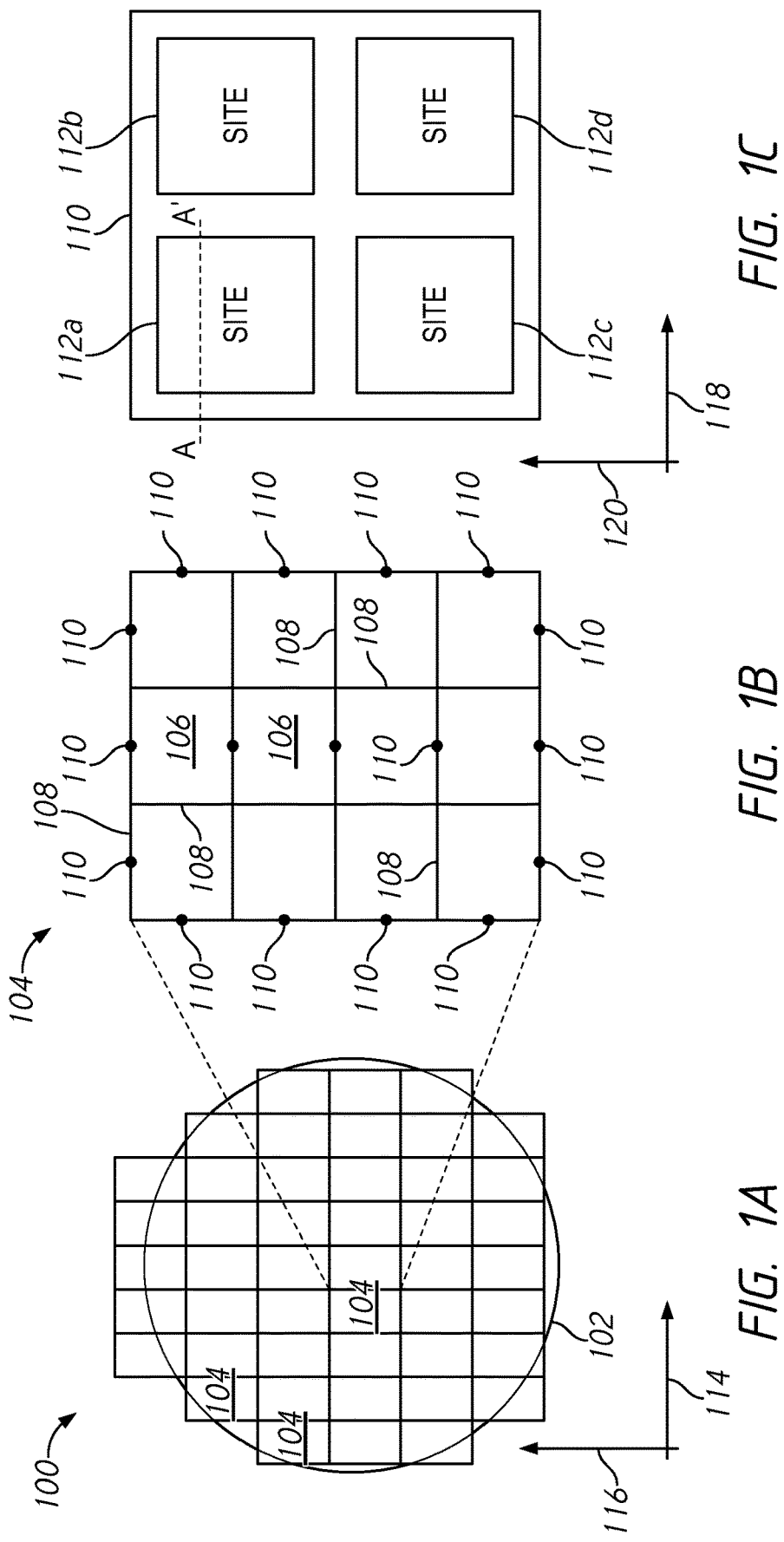
FIG. 1A is a schematic diagram for a layout of a semiconductor device in accordance with an embodiment of the present disclosure.
FIG. 1B is a schematic diagram for a layout of a pattern region in accordance with an embodiment of the present disclosure.
FIG. 1C is a schematic diagram for a layout of an alignment pattern in accordance with an embodiment of the present disclosure.

FIG. 1A is a diagram for a layout of a semiconductor device 100 in accordance with an embodiment of the present disclosure. FIG. 1A is a plan view illustrating a schematic configuration of layout of pattern regions 104 formed on a substrate 102. In some embodiments, the substrate 102 is a wafer. In some embodiments, the substrate 102 may include silicon (Si). The semiconductor device 100 in FIG. 1A may be in a state before the semiconductor device 100 is separated into semiconductor chips. The semiconductor device 100 may be manufactured using photo patterning by applying a reticle on each pattern region 104. The reticle (not shown) includes a pattern image that is transferred to a layer that functions as a mask on each pattern region 104. The reticle may be stepped and repeated in one direction 114 and then to another direction 116 to cover the substrate 102. In some embodiments, the pattern regions 104 may be disposed in a matrix and each pattern region 104 may have a rectangular shape. Thus, all pattern regions 104 on the substrate 102 which do not include a portion beyond the substrate 102 may include a similar pattern according to the pattern image.

FIG. 1B is a schematic diagram for a layout of a pattern region 104 in accordance with an embodiment of the present disclosure. The pattern region 104 may include circuit regions 106 disposed in a matrix. Each circuit region 106 may have a rectangular shape. In each circuit region 106, transistors and circuit components, such as conductive interconnects may be disposed. For example, the transistors and the circuit components may include a plurality of memory cells, one or more circuits that provide memory access functions, such as read operations and write operations to the memory cells, and control circuits that control operation of the various circuit components.

The semiconductor device 100 is separated into semiconductor chips by cutting the semiconductor device 100 along scribe lines 108 during a dicing step. After the semiconductor device 100 is separated, each semiconductor chip may be referred to as a die. The scribe lines 108 are disposed around each circuit region 106. Each scribe line 108 may be disposed between adjacent circuit regions 106 or on an edge of the pattern region 104. In some embodiments, each scribe line 108 may include one or more alignment pattern regions 110.

FIG. 1C is a schematic diagram for a layout of an alignment pattern region 110 in accordance with an embodiment of the present disclosure. The alignment pattern region 110 may be arranged in a plurality of sites 112a-112d. In some embodiments, sites of the plurality of sites 112a-112d that are diagonal to each other may include similar gratings. For example, the sites 112a and 112d are diagonal to each other in the alignment pattern region 110. The sites 112a and 112d may include a plurality of lines (not shown) extending in a direction 120 in parallel. In some embodiments, widths of the plurality of lines in the sites 112a and 112d may be constant and spaces between adjacent lines in the sites 112a and 112d may be constant. The sites 112b and 112c may be disposed diagonal to each other in the alignment pattern region 110. The site 112b may be adjacent to the site 112a in a direction 118 perpendicular to the direction 120 and also adjacent to the site 112d in the direction 120. The site 112c may be adjacent to the site 112a in a direction opposite to the direction 120 and also adjacent to the site 112d in a direction opposite to the direction 118. The sites 112b and 112c may include a plurality of lines (not shown) extending in the direction 120 in parallel. In some embodiments, widths of the plurality of lines in the sites 112b and 112c may be constant and spaces provided as openings between adjacent lines in the sites 112b and 112c may be constant.

Figure 2:
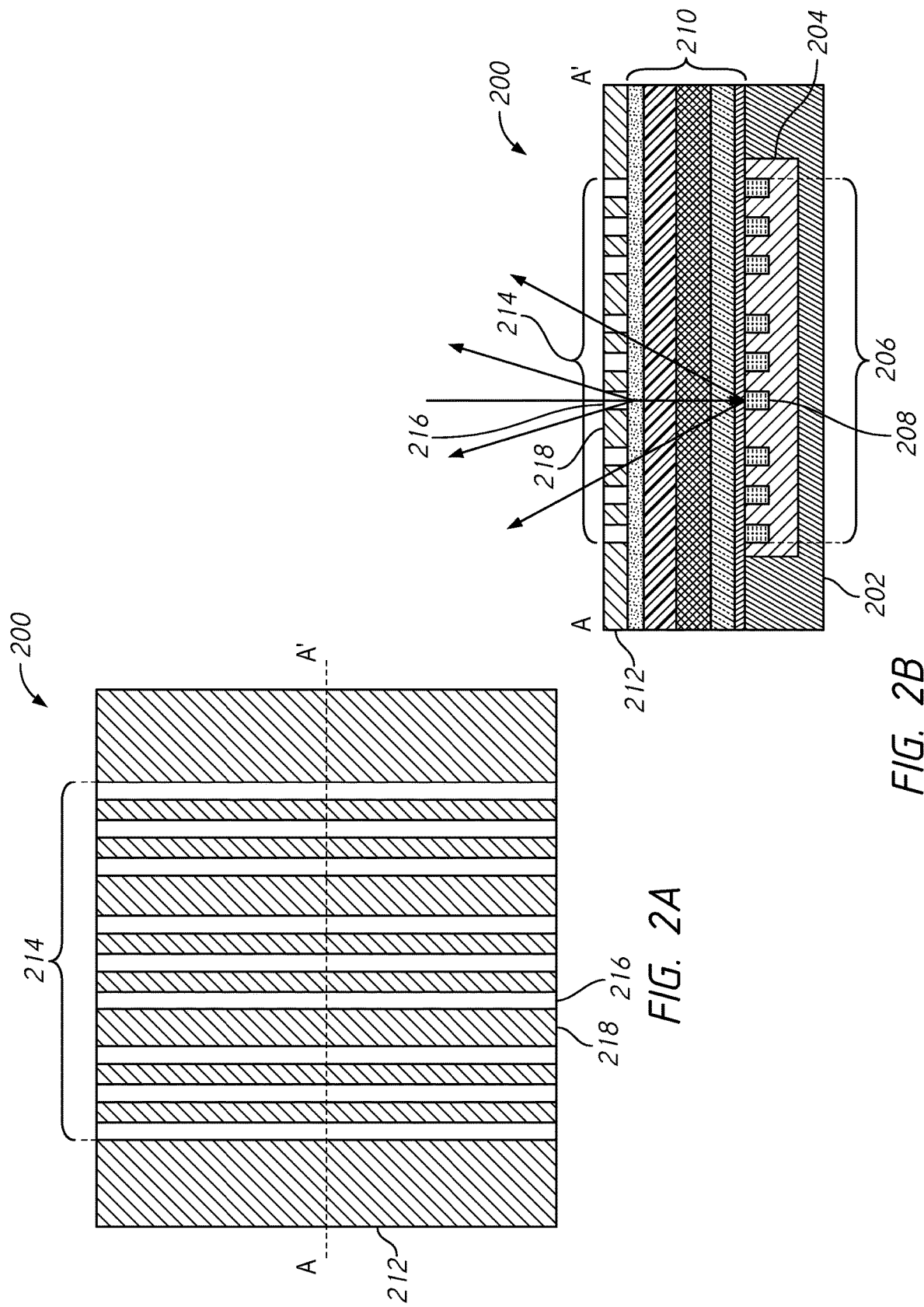
FIG. 2A is a schematic diagram for a plan view of a site in accordance with an embodiment of the present disclosure.
FIG. 2B is a diagram of a vertical cross-sectional view of a schematic structure of the site in accordance with an embodiment of the present disclosure.

FIG. 2A is a schematic diagram for a plan view of a site 200 in accordance with an embodiment of the present disclosure. FIG. 2B is a diagram of a vertical cross-sectional view of one schematic structure of the site 200 in accordance with an embodiment of the present disclosure. FIG. 2B shows the vertical cross-sectional view of the site 200 along a line A-A' in FIG. 2A. In some embodiments of the disclosure, the site 200 is included in one or more of the sites 112a-112d of FIG. 1C. The site 200 may include a substrate 202. The site 200 includes a layer 204 in the substrate 202. The substrate 202 may include a single-crystal silicon (Si), for example. The site 200 includes an alignment pattern 206 including lines 208 disposed in a top portion of the layer 204.

The lines 208 may include conductive material. In some embodiments, the conductive material may be the same material as conductive material included in bit contacts (not shown) in the substrate 102 in the circuit regions 106. For example, the conductive material may include polycrystalline silicon (poly-Si). The layer 204 may include material that has optical constants (e.g., a refractive index "n") relatively different from optical constants of the conductive material of the lines 208 (e.g., polycrystalline silicon) compared to optical constants of the material included in the substrate 202 (e.g., silicon). For example, the material in the layer 204 may include silicon dioxide (SiO2) or silicon nitride (Si2N3).

In some embodiments, the site 200 may further include one or more layers 210 above the substrate 202 and the layer 204. The one or more layers 210 may include a dielectric layer including dielectric material (e.g., silicon nitride (Si2N3), silicon oxide (SiO2)) on the substrate 202 and the layer 204, a conductive layer including conductive material (e.g., carbon), and an anti-reflective barrier layer (e.g. dielectric anti-reflective coating (DARC) and/or bottom anti-reflective coating (BARC)) above the conductive layer. The conductive layer in the one or more layers 210 may include a bit line (not shown) in the circuit regions 106, of the substrate 102. The site 200 includes a photoresist 212 over the substrate 202 and the layer 204. In some embodiments, the photoresist 212 may be on the one or more layers 210. In some embodiments, the photoresist 212 may include polyimide or phenolic resin.

The photoresist 212 may include an alignment pattern 214, including lines 218 disposed on a top surface of the one or more layers 210 and further including openings 216 between adjacent lines 218 of the lines 218. In some embodiments, the openings 216 may be arranged above the lines 208. Diffraction overlays may be measured based on diffraction of incident light reflected at the lines 208 and the openings 216.

Figure 3:
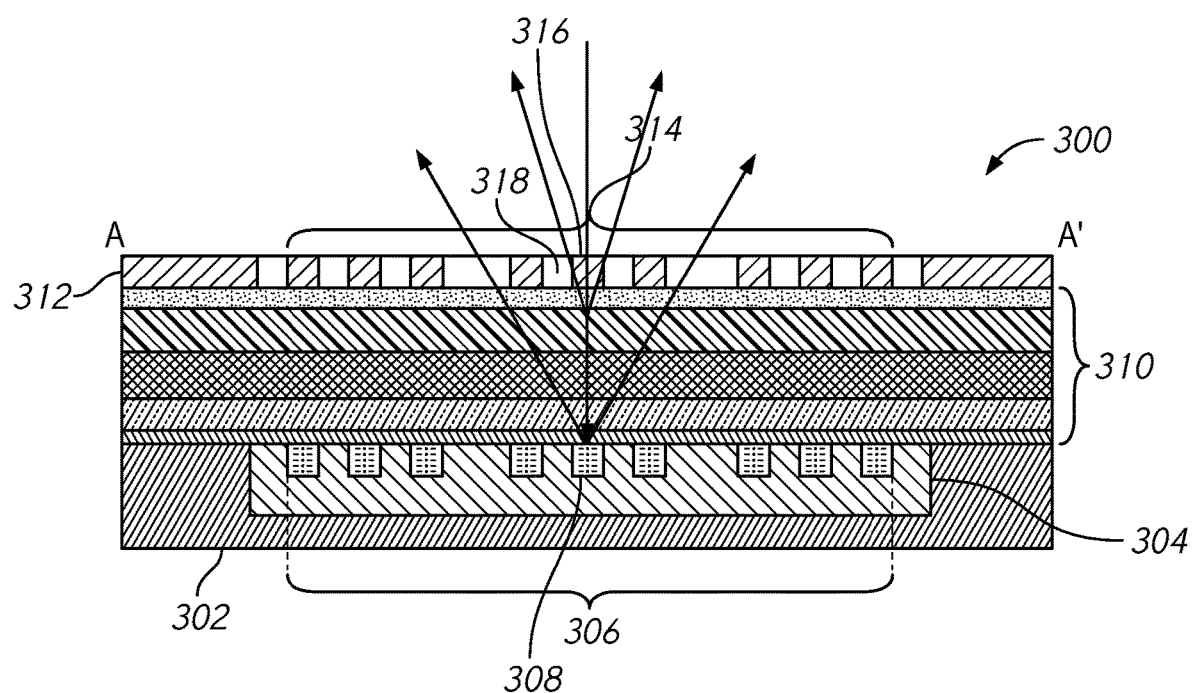
FIG. 3 is a diagram of a vertical cross-sectional view of a schematic structure of a site in accordance with an embodiment of the present disclosure.

FIG. 3 is a diagram of a vertical cross-sectional view of one schematic structure of a site 300 in accordance with an embodiment of the present disclosure. In some embodiments of the disclosure, the site 300 is included in one or more of the sites 112a-112d of FIG. 1C. The site 300 may include a substrate 302. The site 300 includes a layer 304 in the substrate 302. The substrate 302 may include a single-crystal silicon (Si), for example. The site 300 may include an alignment pattern 306 including lines 308 disposed in a top portion of the layer 304.

The lines 308 may include conductive material. In some embodiments, the conductive material may be the same material as conductive material included in bit contacts (not shown) in the substrate 102 in the circuit regions 106. For example, the conductive material may include polycrystalline silicon (poly-Si). The layer 304 may include material that has optical constants (e.g., a refractive index "n") relatively different from optical constants of the conductive material of the lines 308 (e.g., polycrystalline silicon) compared to optical constants of material included in the substrate 302 (e.g., silicon). For example, the material in the layer 304 may include silicon dioxide (SiO2) or silicon nitride (Si2N3).

In some embodiments, the site 300 may further include one or more layers 310 above the substrate 302 and the layer 304. The one or more layers 310 may include a dielectric layer on the substrate 302 and the layer 304, a conductive layer above the dielectric layer and a dielectric layer above the conductive layer. The conductive layer in the one or more layers 310 may include a bit line (not shown) in the circuit regions 106 of the substrate 102. The site 300 includes a layer 312 over the substrate 302 and the layer 304. In some embodiments, the layer 312 may be on the one or more layers 310. In some embodiments, the layer 312 be a photoresist. The layer 312 may include polyimide or phenolic resin, for example.

The layer 312 may include an alignment pattern 314, including lines 316 disposed on a top surface of the one or more layers 310 and further including openings 318 between adjacent lines 316 of the lines 316. In some embodiments, the lines 316 may be arranged to be aligned above the lines 208. Diffraction overlays may be measured based on diffraction of incident light reflected at the lines 308 and the lines 316.

The following describes methods of forming a semiconductor device including the site 200 according to the embodiments with reference to FIG. 4 to FIG. 12. In the following description, above is oriented with the substrate 202 at a bottom of the site 200. The dimensions and the ratios of dimensions of each portion in each drawing do not necessarily coincide with the dimensions and the ratios of dimensions of the actual semiconductor device.

Figure 4:
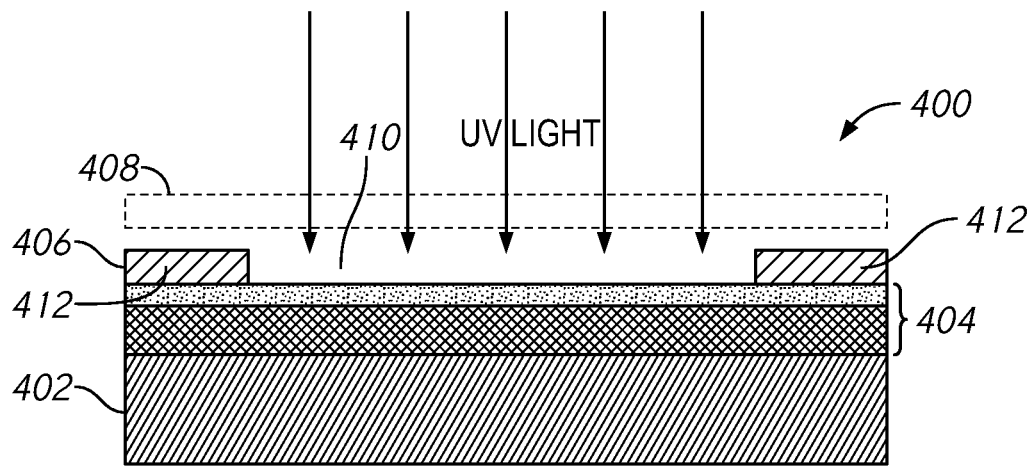
FIG. 4 is a diagram of a vertical cross-sectional view of a schematic structure of a site in accordance with an embodiment of the present disclosure.

FIG. 4 is a diagram of a vertical cross-sectional view of one schematic structure of a site 400 in accordance with an embodiment of the present disclosure. In some embodiments, the site 400 may be an intermediate structure that is used to fabricate a semiconductor device including the site 200 of FIGS. 2A and 2B. The site 400 includes a substrate 402. In some embodiments, the substrate 402 may be disposed across a memory array region (not shown) and a peripheral region (not shown). In some embodiments, the substrate 402 may include a single-crystal silicon (Si), for example. In the following description, above is oriented with the substrate 402 at a bottom of the site 400. The substrate 402 may be covered by one or more layers 404. In some embodiments, the one or more layers 404 may include dielectric materials. For example, the one or more layers 404 may include silicon nitride (Si2N3) and silicon dioxide (SiO2). In some embodiments, polymer may be applied on the one or more layer 404 to cover the entire top surface of the one or more layers 404. In some embodiments, the polymer may be polyimide or phenolic resin. The polymer may be in a liquid form when applied. In some embodiments, the polymer may include a relatively thick film. The polymer may be thermally cured over the one or more layers 404 into a photoresist 406. The photoresist 406 can be patterned using photolithography. In some embodiments, the photoresist 406 may be a negative photoresist and an area under an opening in the photomask 408 may be removed by exposure to light, such as ultraviolet (UV) light. In some embodiments, the photoresist 406 may be a positive photoresist and an area under an opening in the photomask 408 may remain while the rest of the photoresist 460 covered by the photomask 408 may be removed. Either by using the positive photoresist or the negative photoresist, an opening 410 may be formed in a center area of the photoresist 406 in the site 400 while forming an edge 412 from the photoresist 406 around the opening 410.

Figure 5:
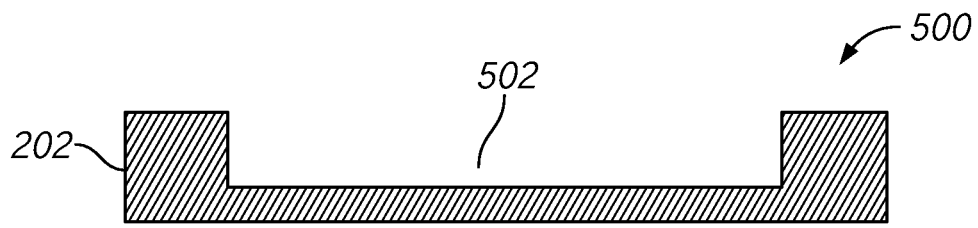
FIG. 5 is a diagram of a vertical cross-sectional view of a schematic structure of a site in accordance with an embodiment of the present disclosure.

FIG. 5 is a diagram of a vertical cross-sectional view of one schematic structure of a site 500 in accordance with an embodiment of the present disclosure. In some embodiments, the site 500 may be fabricated by performing one or more fabrication processes on the site 400. In some embodiments, the site 500 may be an intermediate structure that is used to fabricate the site 200 of FIGS. 2A and 2B.

After forming the edge 412, a portion of the substrate 402 under the opening 410 in FIG. 4 is removed. In some embodiments, the portion of the substrate 402 under the opening 410 may be removed by dry etching to form an opening 502. After forming the opening 502, the edges 412 of the photoresist 406 and the layers 404 may also be removed. Thus, the site 500 including the substrate 202 having the opening 502 at a center of the substrate 202 may be formed.

Figure 6:
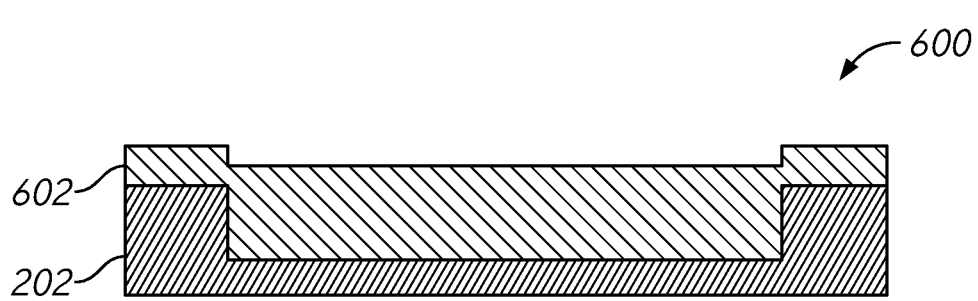
FIG. 6 is a diagram of a vertical cross-sectional view of a schematic structure of a site in accordance with an embodiment of the present disclosure.

FIG. 6 is a diagram of a vertical cross-sectional view of one schematic structure of a site 600 in accordance with an embodiment of the present disclosure. In some embodiments, the site 600 may be fabricated by performing one or more fabrication processes on the site 500. In some embodiments, the site 600 may be an intermediate structure that is used to fabricate the site 200 of FIGS. 2A and 2B.

Material 602 may be embedded in a surface portion the substrate 202 to cover the substrate 202 and fill the opening 502 in the substrate 202. In some embodiments, the material 602 has optical constants (e.g., a refractive index "n") relatively different from optical constants of conductive material (e.g., polycrystalline silicon) of lines (e.g., the lines 208) of an alignment pattern (e.g., the alignment pattern 206) to be disposed later in the material 602 compared to optical constants of material (e.g., silicon) included in the substrate 202. For example, the material 602 may include silicon dioxide (SiO2) or silicon nitride (Si2N3). The material 602 may be deposited by physical vapor deposition (PVD) or chemical vapor deposition (CVD).

FIG. 7 is a diagram of a vertical cross-sectional view of one schematic structure of a site 700 in accordance with an embodiment of the present disclosure. In some embodiments, the site 700 may be fabricated by performing one or more fabrication processes on the site 600. In some embodiments, the site 700 may be an intermediate structure that is used to fabricate the site 200 of FIGS. 2A and 2B.

A top portion of the material 602 may be removed. In some embodiments, the removal of the top portion of the material 602 above the substrate 202 may be performed by chemical-mechanical polishing (CMP). A remained portion of the material 602 in the opening 502 of the substrate 202 becomes a layer 702 in which lines (e.g., the lines 208) of an alignment pattern (e.g., the alignment pattern 206) is to be disposed later. The layer 702 may include, for example, silicon dioxide (SiO2) or silicon nitride (Si2N3).

FIG. 8A is a schematic diagram for a plan view of a site 800 accordance with an embodiment of the present disclosure. FIG. 8B is a diagram of a vertical cross-sectional view of one schematic structure of the site 800 in accordance with an embodiment of the present disclosure. FIG. 8B shows the vertical cross-sectional view of the site 800 along a line A-A' in FIG. 8A. In some embodiments, the site 800 may be fabricated by performing one or more fabrication processes on the site 700. In some embodiments, the site 800 may be an intermediate structure that is used to fabricate the site 200 of FIGS. 2A and 2B.

In some embodiments, polymer may be applied on the site 700 to cover the entire top surface of the substrate 202 and the layer 702. In some embodiments, the polymer may be polyimide or phenolic resin. The polymer may be in a liquid form when applied. In some embodiments, the polymer may include a relatively thick film. The polymer may be thermally cured into a photoresist 802 over the substrate 202. The photoresist 802 can be patterned using photolithography. In some embodiments, the photoresist 802 may be a negative photoresist and an area under an opening in a photomask (not shown) over the photoresist 802 may be removed by exposure to light, such as ultraviolet (UV) light. In some embodiments, the photoresist 802 may be a positive photoresist and an area under an opening in a photomask (not shown) may remain while the rest of the photoresist 802 covered by the photomask may be removed. Either by using the positive photoresist or the negative photoresist, openings 804 may be formed on the layer 702 while forming lines 806 of the photoresist 802 on the layer 702 between adjacent openings 804 of the openings 804.

FIG. 9 is a diagram of a vertical cross-sectional view of one schematic structure of a site 900 in accordance with an embodiment of the present disclosure. In some embodiments, the site 900 may be fabricated by performing one or more fabrication processes on the site 800. In some embodiments, the site 900 may be an intermediate structure that is used to fabricate the site 200 of FIGS. 2A and 2B.

After forming the photoresist 802, a portion of the layer 702 under the openings 804 in FIGS. 8A and 8B is removed. In some embodiments, the portion of the layer 702 under the openings 804 may be removed by dry etching a top surface of the layer 702 exposed in the openings 804. Concurrently, lines 904 masked by the lines 806 of the photoresist 802 may remain to be formed. Thus, openings 902 between the lines 904 may be formed in the layer 204. After dry etching, the photoresist 802 may be removed. Thus, the site 900 including the substrate 202 having the openings 902 in the layer 204 may be formed.

Figure 10:
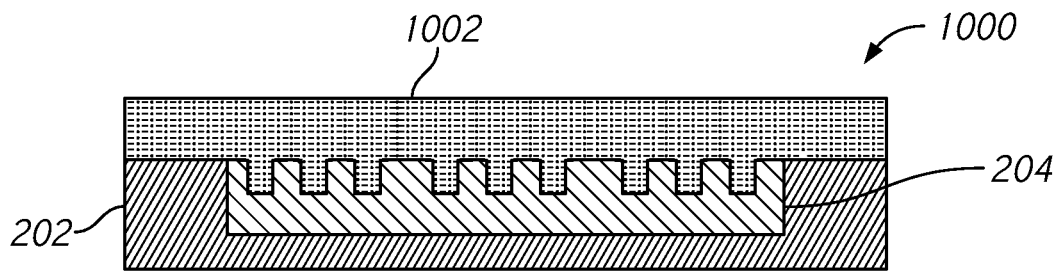
FIG. 10 is a diagram of a vertical cross-sectional view of a schematic structure of a site in accordance with an embodiment of the present disclosure.

FIG. 10 is a diagram of a vertical cross-sectional view of one schematic structure of a site 1000 in accordance with an embodiment of the present disclosure. In some embodiments, the site 1000 may be fabricated by performing one or more fabrication processes on the site 900. In some embodiments, the site 1000 may be an intermediate structure that is used to fabricate the site 200 of FIGS. 2A and 2B.

Conductive material 1002 may be disposed on the site 900 to cover the substrate 202 and the layer 204 and fill the openings 902 in the layer 204. In some embodiments, the conductive material 1002 may be selected to include the same material as conductive material included in bit contacts (not shown) in the substrate 102 in the circuit regions 106. For example, the conductive material may include polycrystalline silicon (poly-Si). The conductive material 1002 may be deposited by physical vapor deposition (PVD) or chemical vapor deposition (CVD).

Figure 11:
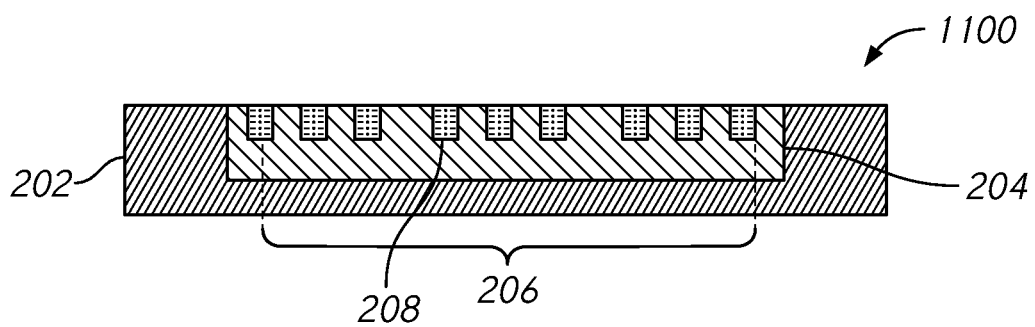
FIG. 11 is a diagram of a vertical cross-sectional view of a schematic structure of a site in accordance with an embodiment of the present disclosure.

FIG. 11 is a diagram of a vertical cross-sectional view of one schematic structure of a site 1100 in accordance with an embodiment of the present disclosure. In some embodiments, the site 600 may be fabricated by performing one or more fabrication processes on the site 500. In some embodiments, the site 600 may be an intermediate structure that is used to fabricate the site 200 of FIGS. 2A and 2B.

A top portion of the conductive material 1002 may be removed. In some embodiments, the removal of the top portion of the conductive material 1002 above the substrate 202 may be performed by chemical-mechanical polishing (CMP). A remained portion of the conductive material 1002 in the openings 902 in the layer 204 become the lines 208 of the alignment pattern 206 disposed in a top portion of the layer 204.

Figure 12:
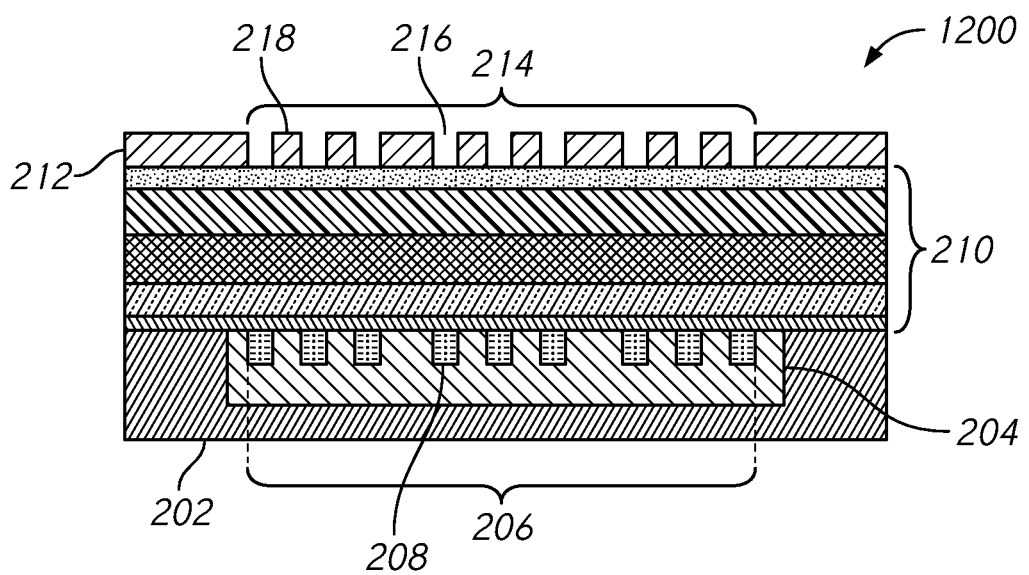
FIG. 12 is a diagram of a vertical cross-sectional view of a schematic structure of a site in accordance with an embodiment of the present disclosure.

FIG. 12 is a diagram of a vertical cross-sectional view of one schematic structure of a site 1200 in accordance with an embodiment of the present disclosure. In some embodiments, the site 1200 may be the site 200 in FIGS. 2A and 2B fabricated by performing one or more fabrication processes on the site 1100.

Above the substrate 202 and the layer 204 including the alignment pattern 206, one or more layers 210 may be disposed. The one or more layers 210 may include a dielectric layer including dielectric material (e.g., silicon nitride (Si2N3), silicon oxide (SiO2)) on the substrate 202 and the layer 204, a conductive layer including conductive material (e.g., carbon), and an anti-reflective barrier layer (e.g. dielectric anti-reflective coating (DARC) and/or bottom anti-reflective coating (BARC)) above the conductive layer. The conductive layer in the one or more layers 210 may be formed to include bit lines (not shown) in the circuit regions 106 of the substrate 102. The bit lines in the circuit regions 106 may be disposed by forming at least some layers of the layers 204 and removing a portion of the layers around the bit lines to remain the bit lines.

In some embodiments, polymer may be applied on the layers 210, to cover the entire top surface of the layers 210. In some embodiments, the polymer may be polyimide or phenolic resin. The polymer may be in a liquid form when applied. In some embodiments, the polymer may include a relatively thick film. The polymer may be thermally cured into the photoresist 212 over the layers 210. The photoresist 212 can be patterned using photolithography. In some embodiments, the photoresist 212 may be a negative photoresist and an area under an opening in a photomask (not shown) over the photoresist may be removed by exposure to light, such as ultraviolet (UV) light. In some embodiments, the photoresist 212 may be a positive photoresist and an area under an opening in a photomask (not shown) may remain while the rest of the photoresist covered by the photomask may be removed. Either by using the positive photoresist or the negative photoresist, openings 216 may be formed on a top surface of the layers 210 while forming lines 218 of the photoresist 212 on the layer 702 between adjacent openings 804 of the openings 804. Thus, the alignment pattern 214 may include the lines 218 of the photoresist 212 and the openings 216 between adjacent lines 218. In some embodiments, the openings 216 may be arranged to be aligned above the lines 208 as shown in FIGS. 2A, 2B and 12. In some embodiments, the lines 218 may be arranged to be aligned above the lines 208 as shown in FIG. 3.

A layer including a lower alignment pattern may be disposed in a substrate. The layer may include material (e.g., silicon dioxide (SiO2), silicon nitride (Si2N3)) that has optical constants (e.g., a refractive index "n") relatively different from optical constants of the conductive material (e.g., polycrystalline silicon (poly-Si)) of a lower alignment pattern disposed in the layer, compared to optical constants of the material of the substrate (e.g., silicon (Si)). By including the layer, a difference between optical constants (a refractive index "n" and an extinction coefficient "k") between the layer and the lower alignment pattern in the layer may become larger and intensity of diffraction of lights from borders between the layer and the lower alignment pattern may be increased. Thus, asymmetries may be obtained and the DBO measurement may become more reliable.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. An apparatus comprising:
a substrate comprising first material;
a first layer comprising second material embedded in a surface portion of the substrate;
a first alignment pattern comprising third material disposed in the first layer; and
a second layer above the first layer comprising a second alignment pattern,
wherein a difference between refractive indexes of the second material and the third material is greater than a difference between refractive indexes of the first material and the third material,
wherein the first alignment pattern comprises a plurality of first lines, wherein the plurality of first lines is in a top portion of the first layer and in a corresponding plurality of first openings in the first layer,
wherein the second alignment pattern comprises a plurality of second lines and a plurality of second openings between adjacent second lines of the plurality of second lines, and
wherein the plurality of second openings are are aligned with the plurality of corresponding first lines.

2. The apparatus of claim 1, wherein the second material comprises at least one of silicon oxide or silicon nitride.

3. The apparatus of claim 1, wherein the first material comprises silicon.

4. The apparatus of claim 1, wherein the second alignment pattern is disposed in a photoresist.

5. The apparatus of claim 4, wherein the photoresist comprises at least one of polyimide or phenolic resin.

6. The apparatus of claim 1, wherein the third material comprises conductive material.

7. The apparatus of claim 6, further comprising:
a plurality of circuit regions;
a scribe line between adjacent circuit regions of the plurality of circuit regions;
an alignment pattern region in the scribe line, including the first layer;
wherein the conductive material is further included in a bit contact disposed in the substrate in a circuit region of the plurality of circuit regions.

8. The apparatus of claim 7, wherein the second alignment pattern is disposed above a layer including a bit line in the circuit region of the plurality of circuit regions.

9. The apparatus of claim 6, wherein the conductive material comprises polycrystalline silicon (poly-Si).

10. A method of forming a pair of alignment patterns in an alignment pattern region of a semiconductor device comprising:
forming a substrate including first material;
removing a portion of the substrate in the alignment pattern region to form an opening in the substrate in the alignment pattern region;
disposing second material to form a layer in the opening;
removing a portion of the layer to form one or more openings in the layer;
disposing third material to fill the one or more openings in the layer to form a first alignment pattern on a top surface of the layer, wherein the first alignment pattern comprises a plurality of first lines; and
disposing a second alignment pattern over the first alignment pattern, wherein the second alignment pattern comprises a plurality of second lines between a plurality of openings wherein the plurality of openings are aligned with the plurality of corresponding first lines,
wherein a difference between refractive indexes of the second material and the third material is greater than a difference between refractive indexes of the first material and the third material.

11. The method of claim 10, wherein removing the portion of the substrate comprises:
forming one or more layers on the substrate;
applying polymer;
thermally curing the polymer into a photoresist;
covering the photoresist with a photomask;
removing a portion of the photoresist by exposing to light over the photomask to form an opening in the photoresist; and
dry-etching the substrate under the opening in the photoresist to form the opening in the substrate.

12. The method of claim 10, wherein disposing the second material to form the layer in the opening in the substrate comprises:
depositing the second material on the substrate to cover the substrate and fill the opening in the substrate; and
removing a top portion of the second material above the substrate.

13. The method of claim 10, wherein disposing the third material to form the first alignment pattern on the top surface of the layer is performed concurrently with disposing the third material to form a bit contact disposed in the substrate in a circuit region of the semiconductor device.

14. The method of claim 10, wherein disposing the second alignment pattern comprises:
disposing one or more layers on the layers and the substrate;
applying polymer on the one or more layers;
thermally curing the polymer into a photoresist;
covering the photoresist with a photomask;
removing a portion of the photoresist by exposing to light over the photomask to form an opening in the photoresist.

15. The method of claim 14,
wherein removing the portion of the photoresist results in the plurality of second lines between the plurality of opening above the plurality of first lines.

16. An apparatus comprising:
a substrate comprising first material;
a plurality of circuit regions; and
a scribe line between adjacent circuit regions of the plurality of circuit regions, comprising:
an alignment pattern region, comprising:
a layer comprising second material in the substrate;
a first alignment pattern comprising third material in the layer; and a second alignment pattern above the first alignment pattern, wherein a difference between refractive indexes of the second material and the third material is greater than a difference between refractive indexes of the first material and the third material, wherein the first alignment pattern comprises a plurality of first lines, wherein the plurality of first lines is in a top portion of the layer and in a corresponding plurality of first openings in the layer, wherein the second alignment pattern comprises a plurality of second lines and a plurality of second openings between adjacent second lines of the plurality of second lines, and wherein the plurality of second openings are are aligned with the plurality of corresponding first lines.

17. The apparatus of claim 16, wherein a combination of the plurality of first lines and the plurality of openings between the plurality of second lines is configured to provide first diffracted light responsive to a light.

18. The apparatus of claim 16, wherein widths of the plurality of first lines and the plurality of second lines is constant.

* * * * *

UNITED STATES PATENT AND TRADEMARK OFFICE
CERTIFICATE OF CORRECTION

| | | Page 1 of 1 |
|---|---|---|
| PATENT NO. | : 12,372,879 B2 | |
| APPLICATION NO. | : 17/555364 | |
| DATED | : July 29, 2025 | |
| INVENTOR(S) | : Kazuko Tsuchiya | |

It is certified that error appears in the above-identified patent and that said Letters Patent is hereby corrected as shown below:

In the Claims

| | Reads | Should Read |
|---|---|---|
| Column 9, Line 39<br>Claim 1 | "second openings are are aligned" | --second openings are aligned-- |
| Column 11, Line 15<br>Claim 16 | "second openings are are aligned" | --second openings are aligned-- |

Signed and Sealed this
Thirteenth Day of January, 2026

John A. Squires
*Director of the United States Patent and Trademark Office*